US009784460B2

(12) United States Patent
Magcale et al.

(10) Patent No.: US 9,784,460 B2
(45) Date of Patent: Oct. 10, 2017

(54) DATA CENTER FACILITY AND PROCESS THAT UTILIZES A CLOSED-LOOPED HEAT MANAGEMENT SYSTEM

(71) Applicant: Nautilus Data Technologies, Inc., San Ramon, CA (US)

(72) Inventors: Arnold C. Magcale, San Ramon, CA (US); Daniel Kekai, San Ramon, CA (US)

(73) Assignee: NAUTILUS DATA TECHNOLOGIES, INC., San Ramon, CA (US)

( * ) Notice: Subject to any disclaimer, the term of this patent is extended or adjusted under 35 U.S.C. 154(b) by 575 days.

(21) Appl. No.: 14/200,461

(22) Filed: Mar. 7, 2014

(65) Prior Publication Data

US 2017/0198928 A1   Jul. 13, 2017

Related U.S. Application Data (60) Provisional application No. 61/861,197, filed on Aug. 1, 2013.

(51) Int. Cl.
G05D 3/12      (2006.01)
F24F 5/00      (2006.01)
G06F 1/20      (2006.01)
H02J 4/00      (2006.01)

(52) U.S. Cl.
CPC .............. *F24F 5/0046* (2013.01); *G06F 1/20* (2013.01); *H02J 4/00* (2013.01)

(58) Field of Classification Search
None
See application file for complete search history.

(56) References Cited

U.S. PATENT DOCUMENTS

| | | | | |
|---|---|---|---|---|
| 6,166,907 A * | 12/2000 | Chien | ................... | F28D 1/0478 |
| | | | | 165/104.33 |
| 6,212,895 B1 | 4/2001 | Richardson | | |
| 6,305,180 B1 * | 10/2001 | Miller | ................ | H05K 7/20572 |
| | | | | 165/104.33 |
| 6,544,085 B1 * | 4/2003 | Menard | .................. | B63H 21/10 |
| | | | | 165/41 |
| 6,848,382 B1 * | 2/2005 | Bekker | .................. | B63H 20/00 |
| | | | | 114/144 B |
| 6,990,395 B2 | 1/2006 | Ransom et al. | | |
| 7,058,710 B2 | 6/2006 | McCall et al. | | |

(Continued)

FOREIGN PATENT DOCUMENTS

| | | |
|---|---|---|
| JP | 2010269641 | 12/2010 |
| WO | 0048288 | 8/2000 |

(Continued)

OTHER PUBLICATIONS http://www.nolimitssoftware.com/wp-content/uploads/2013/03/DCIM-Guide.pdf.

*Primary Examiner* — Adam Lee
(74) *Attorney, Agent, or Firm* — Fernandez & Associates, LLP (57) ABSTRACT

A waterborne data center facility that utilizes a closed-looped heat management system that is both energy-efficient and cost-effective is disclosed. Embodiments employ a closed-looped, energy efficient, cost effective thermal management system that leverages natural resources to control thermal conditions and reduce the overall requirement for cooling power.

13 Claims, 8 Drawing Sheets

Waterborne Data Center - Front Sectional View

(56) References Cited

U.S. PATENT DOCUMENTS

| | | | |
|---|---|---|---|
| 7,278,273 B1 | 10/2007 | Whitted et al. | |
| 7,525,207 B2 | 4/2009 | Clidaras et al. | |
| 7,738,251 B2 | 6/2010 | Clidaras et al. | |
| 7,864,530 B1* | 1/2011 | Hamburgen | H05K 7/20827 165/104.33 |
| 8,359,191 B2 | 1/2013 | Chen et al. | |
| 8,853,872 B2 | 10/2014 | Clidaras et al. | |
| 9,377,832 B1* | 6/2016 | Heydari Monfared | H05K 7/1457 |
| 9,557,792 B1* | 1/2017 | Potlapally | G06F 1/28 |
| 2002/0010709 A1 | 1/2002 | Culbert et al. | |
| 2002/0017107 A1* | 2/2002 | Bailey | F24F 3/001 62/238.7 |
| 2003/0037905 A1* | 2/2003 | Weng | F24F 5/0035 165/60 |
| 2003/0060952 A1* | 3/2003 | Kanno | G05B 23/0235 701/32.7 |
| 2004/0008483 A1* | 1/2004 | Cheon | G06F 1/20 361/679.53 |
| 2004/0008490 A1* | 1/2004 | Cheon | H05K 7/20254 361/699 |
| 2005/0235671 A1* | 10/2005 | Belady | F24F 3/06 62/259.2 |
| 2006/0062201 A1* | 3/2006 | Funk | G01D 21/00 370/352 |
| 2006/0124043 A1* | 6/2006 | Tracht | B63B 39/061 114/144 RE |
| 2006/0259201 A1 | 11/2006 | Brown | |
| 2007/0139883 A1* | 6/2007 | Pinkerton, III | H01L 23/473 361/696 |
| 2007/0176060 A1* | 8/2007 | White | A61B 50/13 248/124.1 |
| 2007/0213000 A1 | 9/2007 | Day | |
| 2007/0281639 A1 | 12/2007 | Clidaras et al. | |
| 2008/0062647 A1* | 3/2008 | Hillis | G06F 1/20 361/699 |
| 2008/0209234 A1 | 8/2008 | Clidaras et al. | |
| 2008/0259566 A1* | 10/2008 | Fried | F28D 15/0266 361/699 |
| 2009/0037268 A1 | 2/2009 | Zaid et al. | |
| 2009/0083126 A1 | 3/2009 | Koren et al. | |
| 2009/0084297 A1* | 4/2009 | Choi | B63B 35/44 114/56.1 |
| 2009/0126910 A1 | 5/2009 | Campbell et al. | |
| 2009/0207567 A1 | 8/2009 | Campbell et al. | |
| 2009/0228726 A1* | 9/2009 | Malik | G06F 1/3203 713/320 |
| 2009/0295167 A1* | 12/2009 | Clidaras | F03B 13/20 290/55 |
| 2009/0299824 A1 | 12/2009 | Barnes | |
| 2010/0030552 A1 | 2/2010 | Chen et al. | |
| 2010/0067193 A1* | 3/2010 | Arimilli | H05K 7/20809 361/679.47 |
| 2010/0211239 A1* | 8/2010 | Christensen | B63B 35/816 701/21 |
| 2010/0236772 A1* | 9/2010 | Novotny | H05K 7/2079 165/287 |
| 2010/0262313 A1* | 10/2010 | Chambers | G05B 15/02 700/295 |
| 2010/0298997 A1 | 11/2010 | Ohba et al. | |
| 2011/0047554 A1* | 2/2011 | Lakshmanan | G06F 9/5088 718/105 |
| 2011/0047555 A1* | 2/2011 | Lakshmanan | G06F 9/5088 718/105 |
| 2011/0060470 A1 | 3/2011 | Campbell et al. | |
| 2011/0063792 A1* | 3/2011 | Schmidt | G06F 1/20 361/679.46 |
| 2011/0072293 A1 | 3/2011 | Mazzaferri et al. | |
| 2011/0100004 A1* | 5/2011 | Al-Mazeedi | G05B 13/021 60/641.8 |
| 2011/0100045 A1* | 5/2011 | Carlson | H05K 7/20836 62/259.2 |
| 2011/0100618 A1* | 5/2011 | Carlson | F24F 11/0001 165/287 |
| 2011/0207391 A1 | 8/2011 | Hamburgen et al. | |
| 2011/0220321 A1* | 9/2011 | Hawthorne | F24J 3/081 165/45 |
| 2011/0225997 A1* | 9/2011 | Gast, Jr. | F28F 27/003 62/121 |
| 2011/0232889 A1* | 9/2011 | Eckberg | F28D 1/0435 165/200 |
| 2011/0239671 A1* | 10/2011 | Malone | H05K 7/2079 62/178 |
| 2011/0256822 A1* | 10/2011 | Carlson | H05K 7/20827 454/184 |
| 2012/0042263 A1 | 2/2012 | Rapaport et al. | |
| 2012/0048756 A1* | 3/2012 | Chang | G05D 23/1931 206/320 |
| 2012/0054527 A1* | 3/2012 | Pfeifer | G06F 1/266 713/340 |
| 2012/0123595 A1* | 5/2012 | Bower, III | G05D 23/1934 700/282 |
| 2012/0134107 A1* | 5/2012 | Peng | H05K 7/2079 361/679.47 |
| 2012/0136998 A1 | 5/2012 | Hough et al. | |
| 2012/0166433 A1 | 6/2012 | Tseng | |
| 2012/0166616 A1 | 6/2012 | Meehan et al. | |
| 2012/0185569 A1* | 7/2012 | Das | H04W 4/006 709/219 |
| 2012/0200992 A1* | 8/2012 | Schmitt | H05K 7/1497 361/679.02 |
| 2013/0014926 A1* | 1/2013 | Iyengar | F28D 15/00 165/200 |
| 2013/0055714 A1* | 3/2013 | Lakic | F24J 3/083 60/641.2 |
| 2013/0081778 A1* | 4/2013 | Good | H05K 7/20754 165/11.1 |
| 2013/0098597 A1* | 4/2013 | Fujimoto | H05K 7/20745 165/287 |
| 2013/0238795 A1 | 9/2013 | Geffin et al. | |
| 2014/0124168 A1* | 5/2014 | Dean | G06F 1/20 165/67 |
| 2014/0230805 A1* | 8/2014 | Bi | F24H 1/287 126/615 |
| 2014/0240920 A1* | 8/2014 | Cox | G06F 1/20 361/679.53 |
| 2014/0259618 A1 | 9/2014 | Rikoski et al. | |

FOREIGN PATENT DOCUMENTS

| | | |
|---|---|---|
| WO | 2009055368 | 4/2009 |
| WO | 2010129341 | 11/2010 |
| WO | 2012047746 | 4/2012 |
| WO | 2013113138 | 8/2013 |

\* cited by examiner

Fig. 1
Waterborne Data Center – Front Sectional View

Fig. 2
Heat Exchange and Closed-Loop Cooling – Side Sectional View

Fig. 3

Thermal Containment Top Closed-Loop Cooling – Sectional Views

Fig. 4

Thermal Containment Rear Closed-Loop Cooling – Sectional Views

Fig. 5
Waterborne Data Center - Side Sectional View

Fig. 6
Waterborne Data Center - Top Sectional View

Fig. 7

Waterborne Data Center – Top Sectional View – Below Main Deck

Fig. 8
Waterborne Data Center - Top Sectional View

DATA CENTER FACILITY AND PROCESS THAT UTILIZES A CLOSED-LOOPED HEAT MANAGEMENT SYSTEM

CROSS REFERENCE TO RELATED APPLICATIONS

This application claims reference to Provisional Patent application No. 61/861,197 filed on Aug. 1, 2013, entitled "A waterborne data center facility and process that utilizes a closed-looped heat management system that is both energy efficient and cost effective".

FIELD

The present invention relates to data center facilities housed on marine vessels.

BACKGROUND OF THE INVENTION

Data centers and co-location providers in particular struggle with both supplying requisite power as well as cooling. As data center density continues to increase there is a growing demand for more energy efficient and cost effective data centers and co location solutions.

A data center is designed to maintain interior ambient conditions suitable for proper operation of the computer systems therein. Typical data centers may consume more than twice the power needed to support the plurality of computer systems housed therein. This is a result of the inefficient air conditioning units that may account for half of the total power consumed in the data center to cool the plurality of computer systems therein. This inefficiency prohibits support of high density computing systems in today's data centers.

Embodiments disclose a waterborne data center facility employing a closed-looped, energy efficient, cost effective thermal management system that leverages natural surrounding resources to control thermal conditions and reduce the overall requirement for cooling power.

SUMMARY

A data center facility comprising: a marine vessel comprising a heat exchange system, a bow section, a stern section, a starboard section, and a port section; a computer data center, wherein the computer data center comprises a plurality of computing units, and wherein the computer data center is comprised in the marine vessel; an electrical power generator; a thermal containment system; a thermal airflow system; a hot water return cooling system; and a software management suite. The water based closed-loop cooling system comprises a single or plurality of filtered water intake pipes and water exhaust pipes; a single or plurality of water pumps, heat exchangers, coolant heat exchange piping; a closed-loop coolant distribution unit comprising means for using surrounding water as a coolant; and coolant distribution piping. The software management suite further comprises a Data Center Infrastructure Management (DCIM) system with predictive analytics and configured for continuously collecting and analyzing data from a plurality of infrastructure systems, components and wireless sensors. According to alternate embodiments the heat exchange system is partially or completely comprised in the hull of the marine vessel, making for a hull heat exchange system, or a hull heat exchanger.

In a data center facility, a method comprising generating electrical power and providing the generated electrical power to the data-center, wherein any excess power is stored as back up or transmitted through a grid network; pumping surrounding water in close proximity to the data center facility and circulating the pumped water through a closed loop cooling system; wherein the closed loop cooling system is comprised in a heat exchanger; wherein the surrounding water is drawn by water pumps through filtered water intake pipes to be pumped through one side of the heat exchanger, where it serves as a heat sink to cool hot coolant from a coolant distribution unit being pumped through the other side of the heat exchanger; and expelling the pumped water after absorbing the heat from the hot coolant through filtered water exhaust pipes.

In a data center facility, a method of monitoring and managing the facility, the method comprising collecting of environmental data by a plurality of infrastructure systems, components and wireless sensors; storing the collected data in a database; analyzing the stored data by a predictive analytics engine, wherein the analyzed data is employed by a Data Center Infrastructure Management (DCIM) element controller to manage infrastructure systems and components' operational states to sustain optimal infrastructure efficiency.

DETAILED DESCRIPTION OF THE INVENTION

As stated above, Data centers and co-location providers in particular struggle with both supplying requisite power as well as cooling. As data center density continues to increase there is a growing demand for more energy efficient and cost effective data centers and co-location solutions. The invention claimed here solves this problem.

Through our holistic approach to data center architecture, thermal management and energy consumption, we are creating state-of-the-art waterborne data center facilities that maximize efficiencies by leveraging technology and the surrounding environment, with virtually no ecological impact, ultimately passing substantial savings on energy spent to our partners and customers.

The claimed invention differs from, and is an improvement on what currently exists. Embodiments disclose a waterborne solution to data center thermal management and energy consumption. Preferred embodiments are designed to maximize efficiencies by leveraging technology and Nature with virtually no impact to the surrounding environment, resulting in substantial costs savings passed on to customers.

Computer room air conditioner (CRAC) units are poorly designed for data centers because they are energy inefficient and are typically designed to be approximately 6' tall, limiting the ability of the units to treat the hottest air in the data center which rises closer to ceiling height. Hot air and cold air are allowed to freely mix in today's typical data center, which greatly reduces the efficiency of cooling systems.

Embodiments of our waterborne data center facility employ a closed-looped, energy efficient, cost effective thermal management system that leverages natural resources to control thermal conditions and reduce the overall requirement for cooling power.

Figure 2:
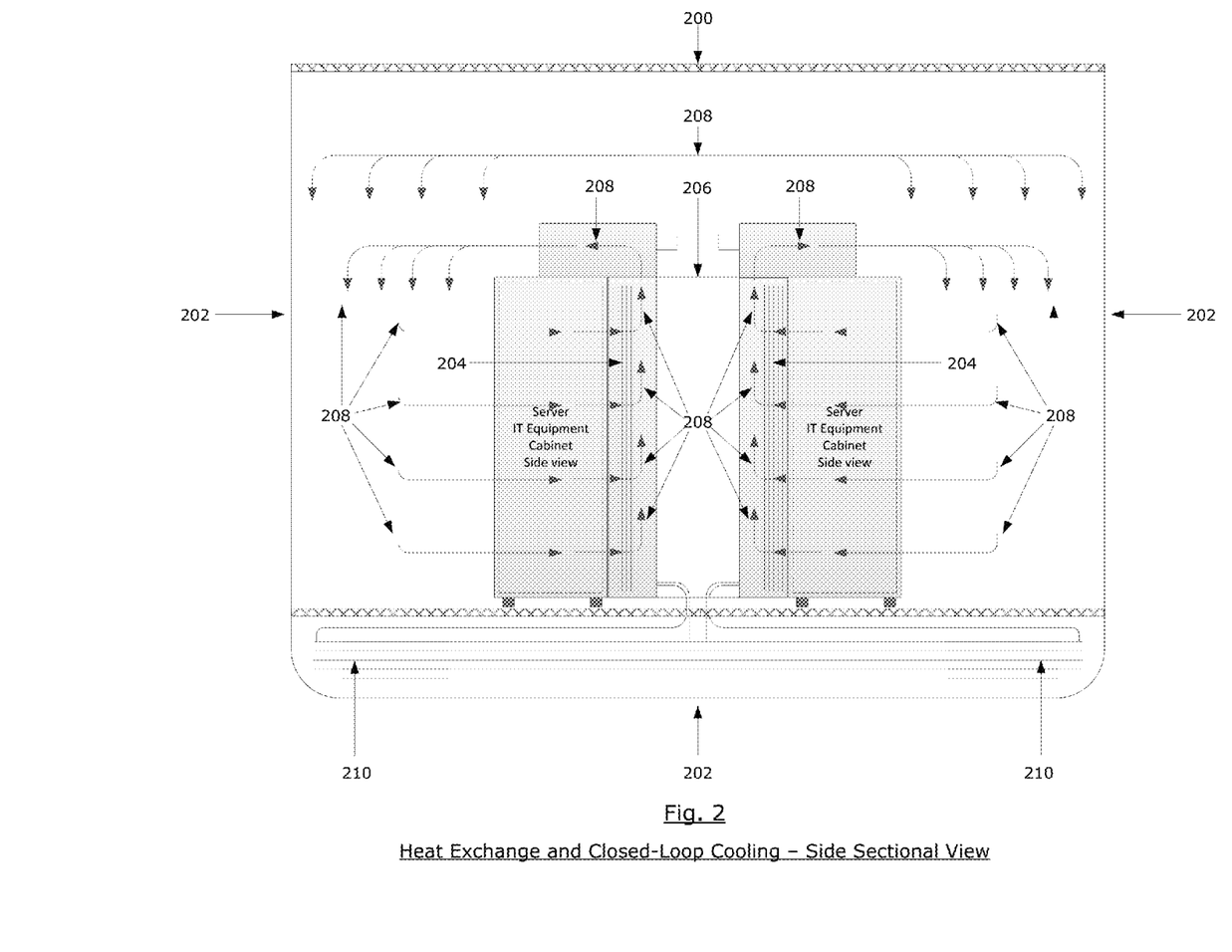
FIG. 2 illustrates a heat exchange and closed-loop cooling side sectional view
Figure 3:
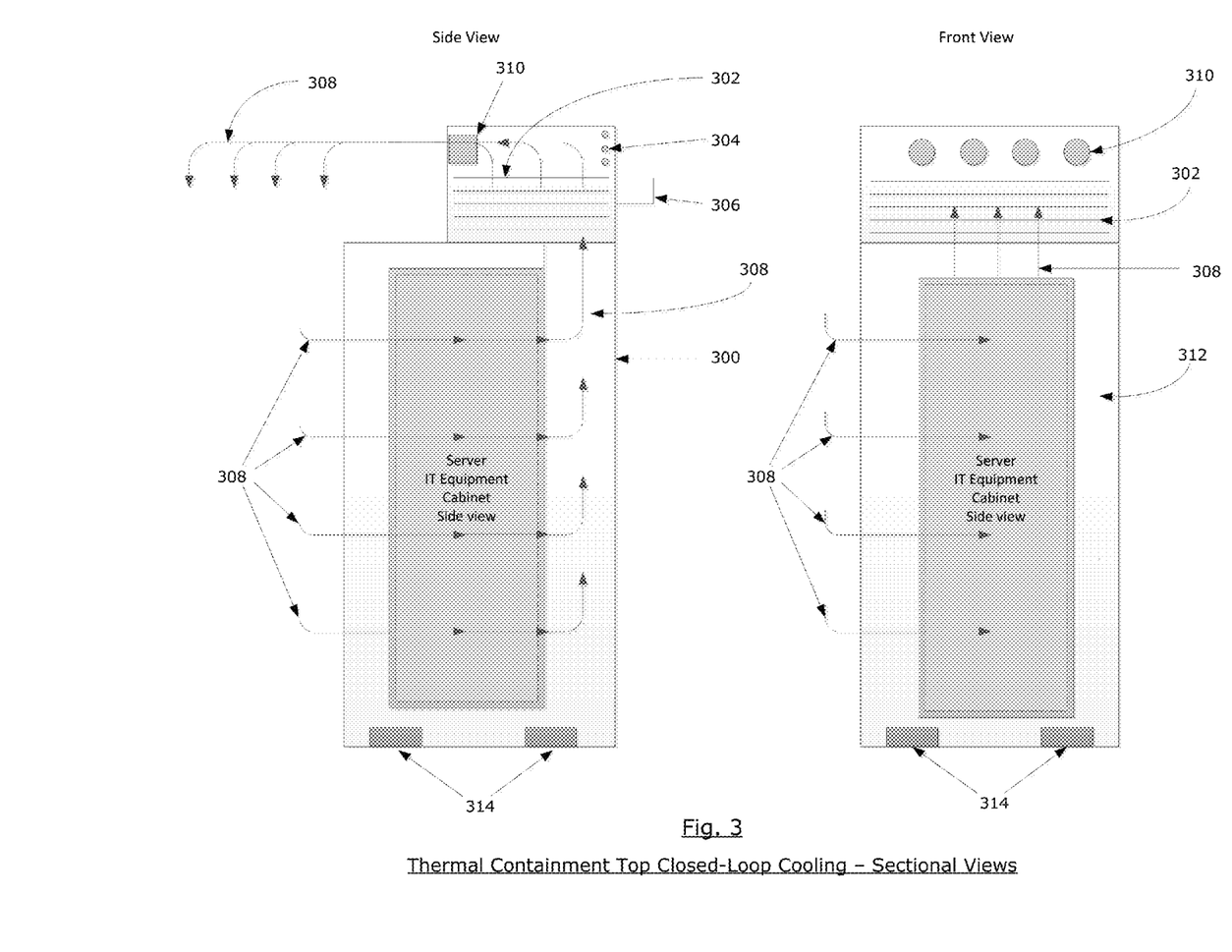
FIG. 3 illustrates a thermal containment top closed-loop cooling sectional view
Figure 4:
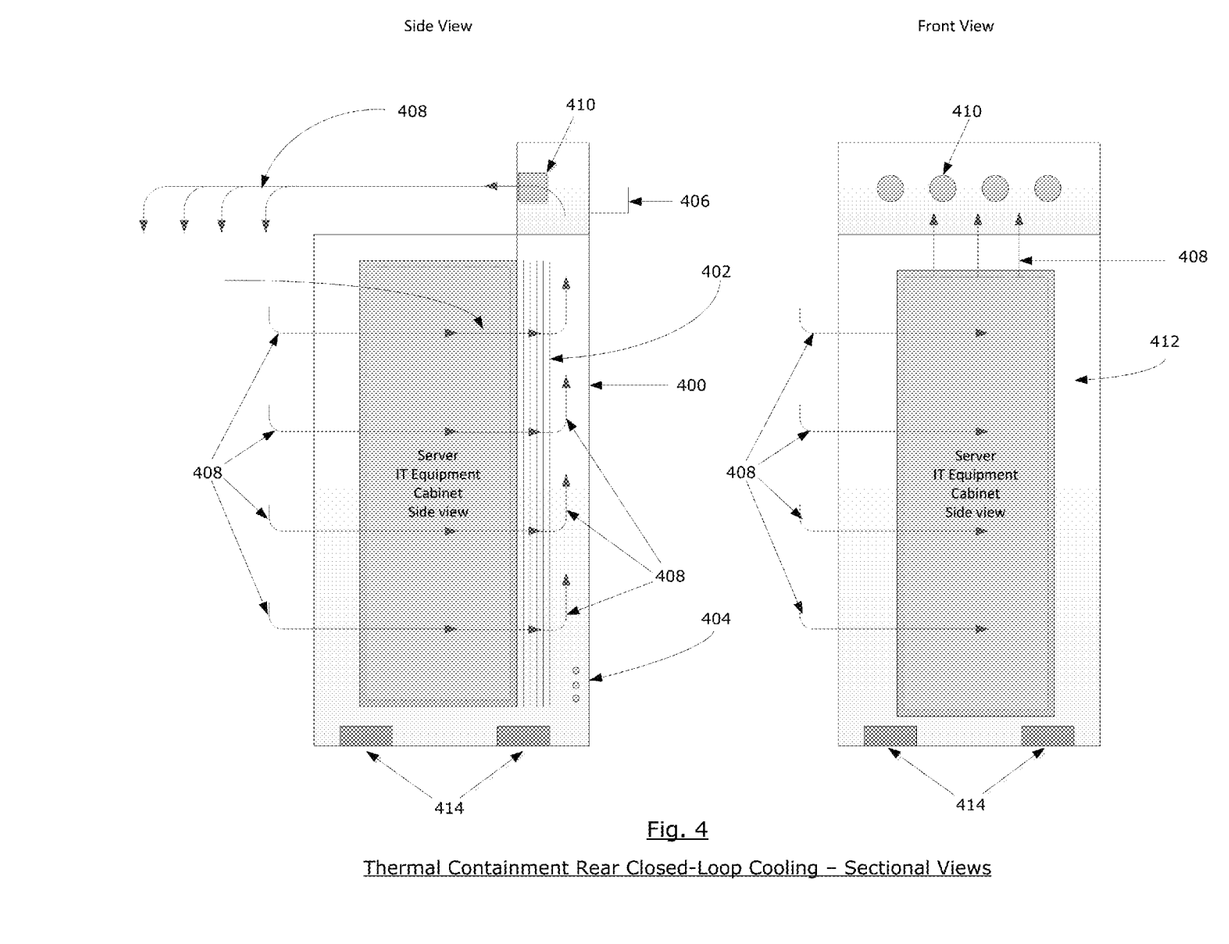
FIG. 4 illustrates a thermal containment rear closed-loop cooling sectional view
Figure 5:
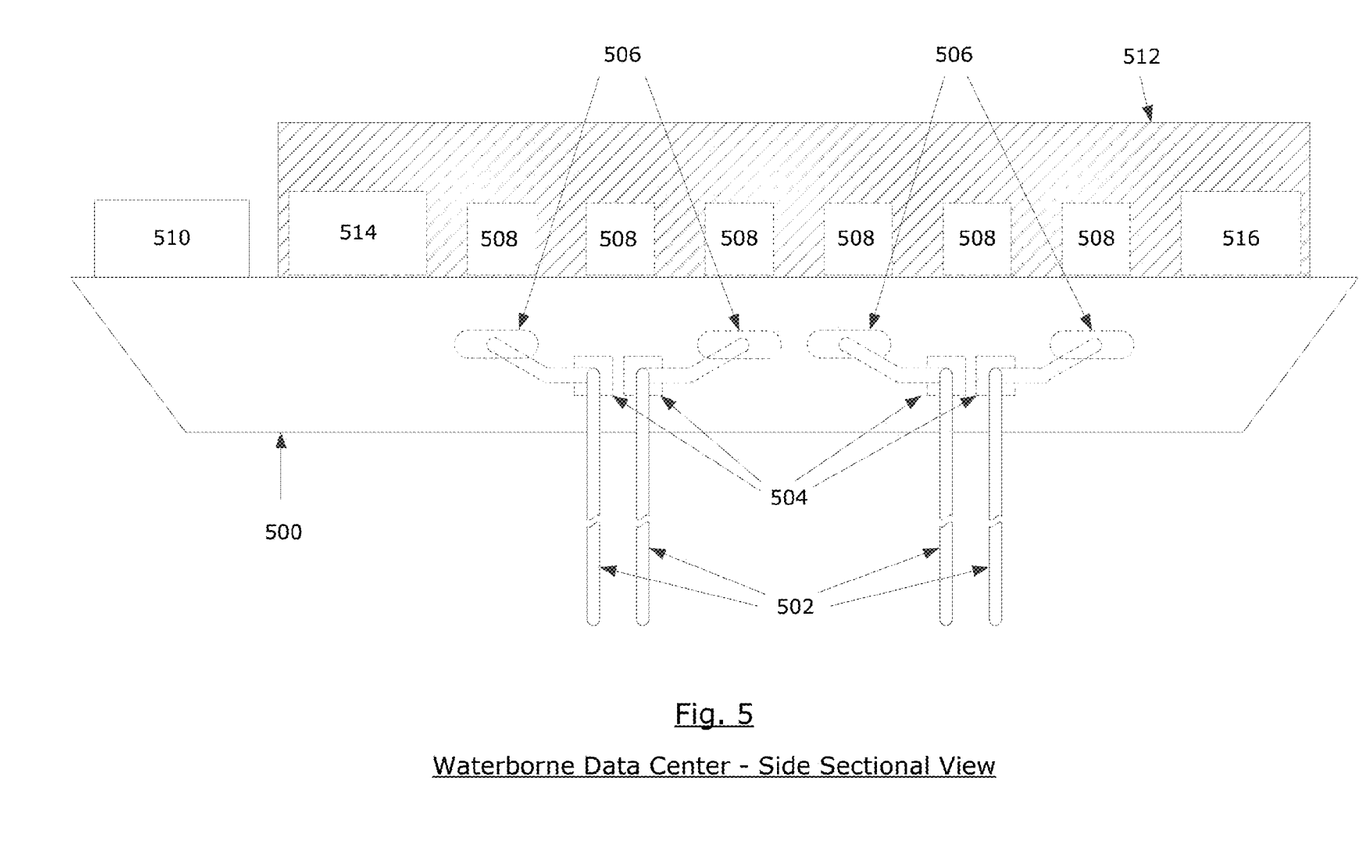
FIG. 5 illustrates a waterborne data center side sectional view
Figure 6:
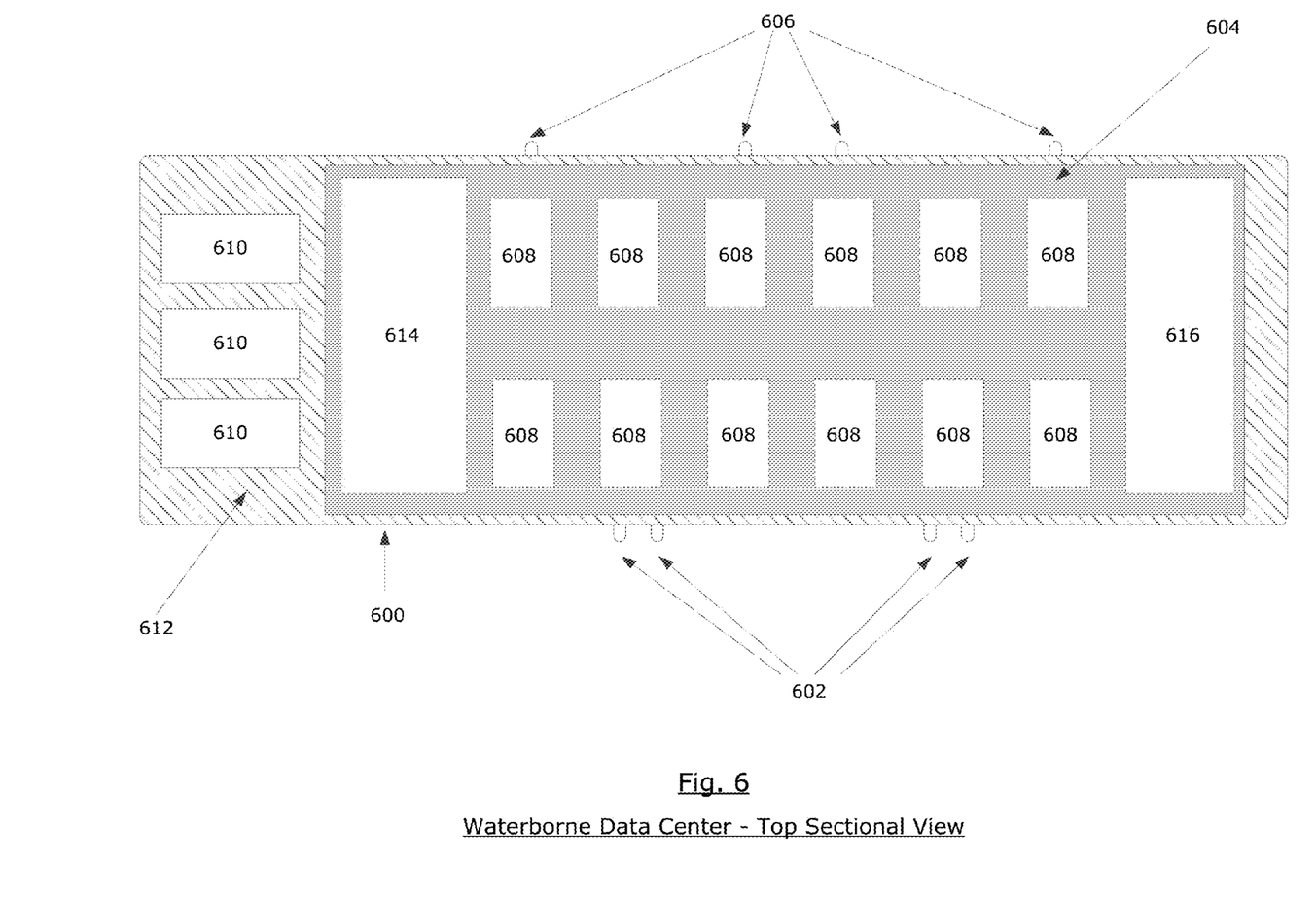
FIG. 6 illustrates a waterborne data center top sectional view
Figure 7:
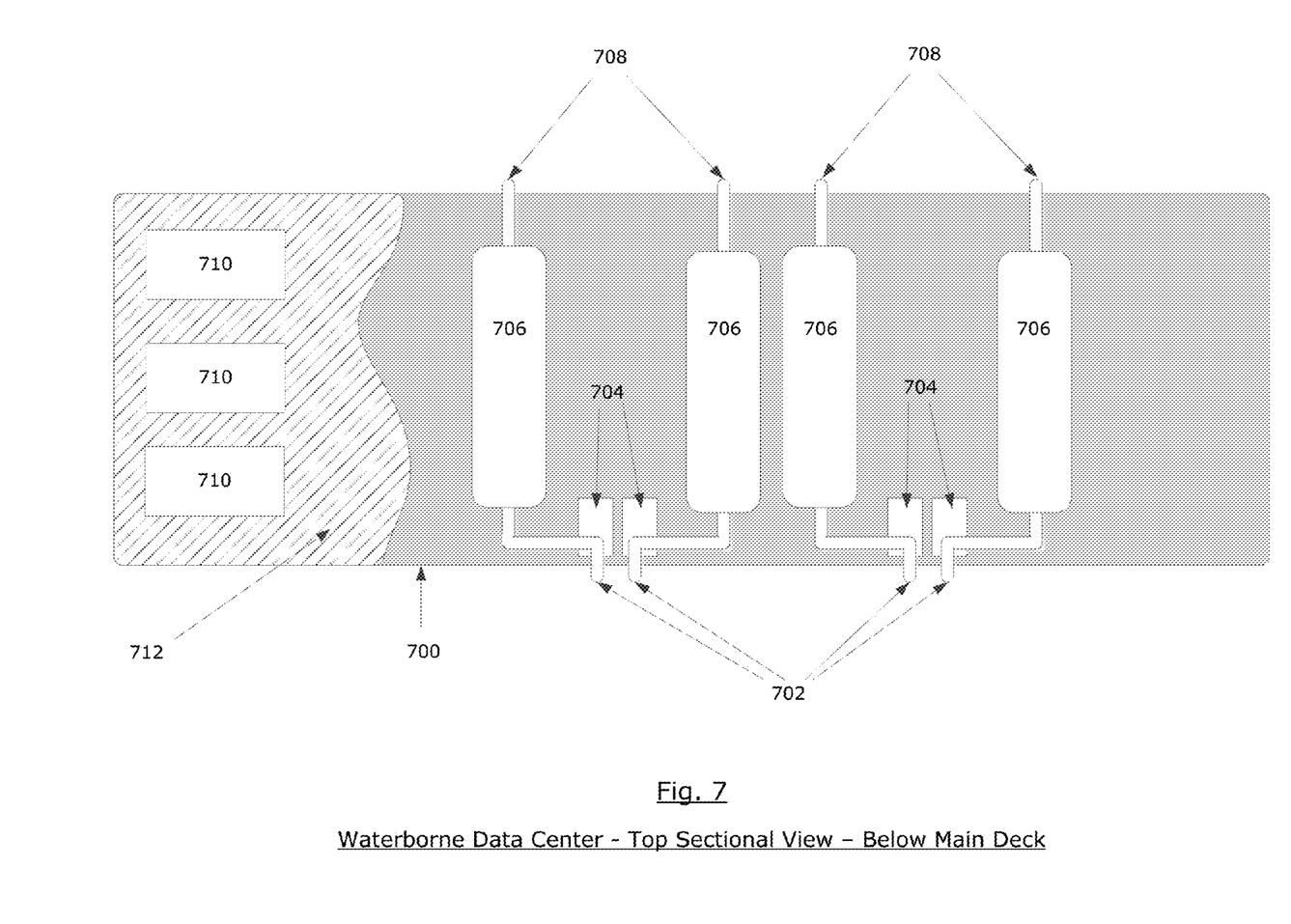
FIG. 7 illustrates a waterborne data center top sectional view below main deck
Figure 8:
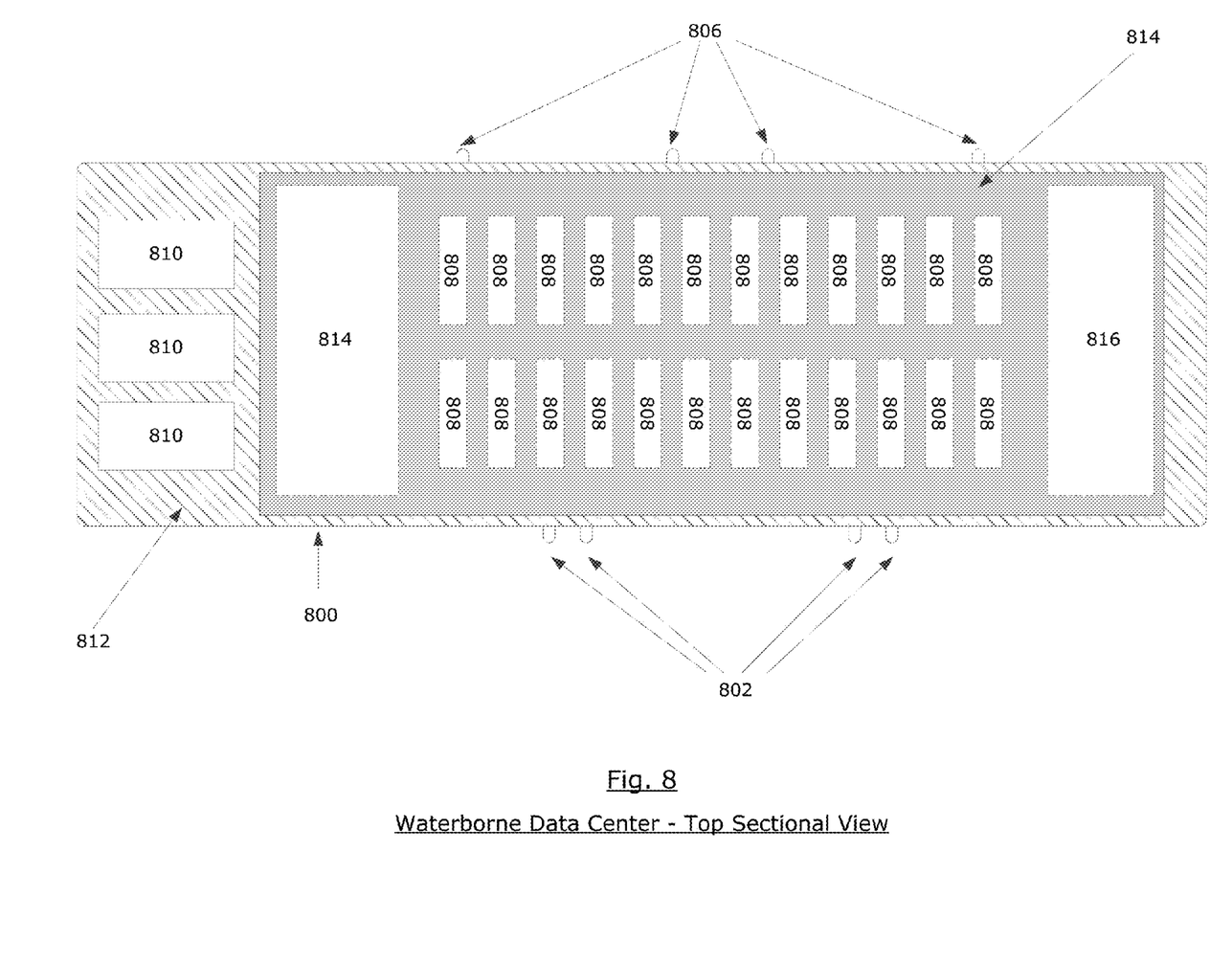
FIG. 8 illustrates a waterborne data center top sectional view

An embodiment includes the following: 1. A Purpose-built marine vessel (FIG. 5, 500; FIG. 6, 600; FIG. 7, 700; FIG. 8, 800); 2. A Hull heat exchange system (FIG. 1, 102; FIG. 2, 202); 3. A water based closed-looped cooling system (FIG. 1, 104; FIG. 2, 204; FIG. 3, 302; FIG. 4, 402; FIG. 5, 516; FIG. 6, 616; FIG. 8, 816); 4. A thermal containment system (FIG. 2, 206; FIG. 3, 300; FIG. 4, 400); 5. A thermal airflow system (FIG. 1, 106; FIG. 2, 208; FIG. 3, 308; FIG. 4, 408); 6. A hot water return cooling system (FIG. 1, 108; FIGS. 2, 210); and 7. A management software suite.

Figure 1:
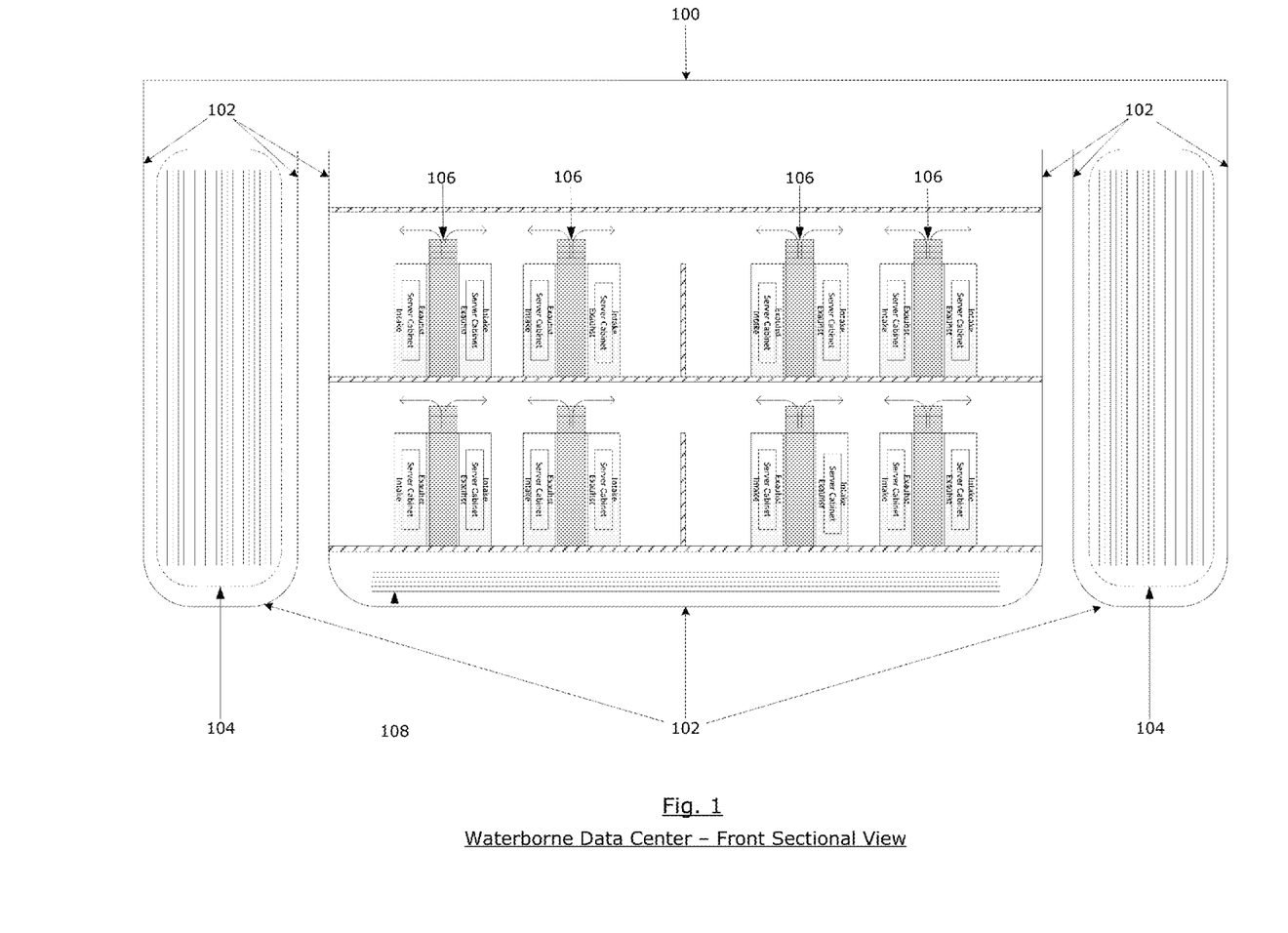
FIG. 1 illustrates a waterborne data center front sectional view

Relationship Between the Components:

FIG. 1 illustrates a waterborne data center front sectional view. According to an embodiment, water borne data center 100 comprises a heat exchanger 102 (wherein, in an optional embodiment the heat exchanger is partially or wholly comprised in the hull of the water borne data center), a water based closed loop cooling system 104, a thermal air flow cool air return system 106, and a hot water return cooling system 108.

According to an embodiment the purpose-built marine vessel (1) is used to house all components. The data center space is comprised in the marine vessel, wherein thermal containment systems (4) and thermal airflow system (5) are built into the data center space in the purpose-built, non-navigable marine vessel (1). It should be noted however, that alternate embodiments may include a navigable marine vessel. The water based closed-loop cooling system (3) is comprised within the thermal containment system (4) situated behind or above each rack and also within the sides and bottom of the purpose-built, non-navigable marine vessel (1). The management software suite (7) can be run in the data center within the purpose built marine vessel (1) or from a remote site.

FIG. 2 illustrates heat exchange and closed-loop cooling side sectional view. According to an embodiment, the water based closed-loop cooling system (FIG. 1, 104; FIG. 2, 204; FIG. 3, 302; FIG. 4, 402; FIG. 8, 816) comprises filtered water intake pipes (FIG. 5, 502; FIG. 6, 602; FIG. 7, 702; FIG. 8, 802), filtered water exhaust pipes (FIG. 7, 708), water pumps (FIG. 5, 504; FIG. 7, 704; FIG. 8, 804), heat exchangers (FIG. 1, 102; FIG. 2, 202; FIG. 5, 506; FIG. 6, 606; FIG. 7, 706; FIG. 8, 806), coolant heat exchange piping, closed-loop coolant distribution unit that may use freshwater as a coolant, and coolant distribution piping. The data center facility 100 comprises a plurality of computer systems installed in a plurality of data center modules. Data center modules are structurally similar in shape and size to shipping containers. The data center modules in general comprise a plurality of racks, a plurality of rack-mounted computer systems and water-based cooling units. In alternate embodiments, the filtered water intake pipes and filtered water exhaust pipes may be installed in the bow (front) or stern (back) section of the waterborne data center vessel instead of on the starboard (right) or port (left) sides of the vessel. The closed-loop coolant distribution unit may be connected to the heat exchangers and to the data center modules according to an embodiment.

FIG. 3 illustrates thermal containment top closed-loop cooling sectional view. FIG. 4 illustrates thermal containment rear closed-loop cooling sectional view. Thermal containment (300, 400) comprises water based closed loop cooling (302, 402), quick connects water (304, 404), fiber ladder (306, 406), thermal air flow cool air return (308, 408), VFD fans cool air return (310, 410), cable power management (312, 412) and pallet jack slots/recessed wheels (314, 414). The heat generated by the computing systems in the data center modules is absorbed by the energy-efficient water based closed-loop cooling system 302, 402.

FIG. 5 illustrates a side sectional view of the water borne data center. FIG. 6 illustrates a top sectional view of the waterborne data center. FIG. 7 illustrates the waterborne data center top sectional view below the main deck. And FIG. 8 further illustrates waterborne data center top sectional view. According to an embodiment the water borne data center comprises the purpose built marine vessel (500, 600, 700, 800), filtered water intake tubes (502, 602, 702, 802), filtered water exhaust tubes 708, water pumps (504, 704, 804), heat exchangers (506, 606, 706, 806), containers (508, 608), row of racks 808, generators (510, 610, 710, 812), data center facility (512, 604, 810), electrical switch room (514, 614, 814), closed loop cooling system (516, 616, 816), main deck 612, 712. Naturally cold water may be drawn by the water pumps through the filtered water intake pipes to be pumped through one side of the heat exchangers where it serves as a heat sink to cool the hot coolant from the coolant distribution unit being pumped through the other side of the heat exchangers. The naturally cold water after absorbing the heat from the hot coolant may then be pumped from the waterborne data center facility and expelled through filtered water exhaust pipes. In an embodiment, freshwater may be used as a coolant wherein the coolant is pumped to the data center module cooling units (not pictured) where it absorbs heat generated by the plurality of computing systems therein. The heated coolant is returned from the data center module cooling units, pumped through one side of the heat exchangers while naturally cold water is being pumped through the other side of the heat exchanger absorbing heat from the hot coolant.

The management suite further comprises a Data Center Infrastructure Management (DCIM) system with predictive analytics and configured for continuously collecting and analyzing data from a plurality of infrastructure systems, components and wireless sensors. A plurality of wireless sensors may be employed to continuously collect environmental data. The data collected by the DCIM system may be stored in a database. The stored data may then be analyzed by a predictive analytics engine. The analyzed data may be employed by the DCIM element controller to manage infrastructure systems and components' operational states to sustain optimal infrastructure efficiency.

Presentation software comprised in the DCIM permits viewing of all the collected and analyzed data by an end user with the presentation software, and the DCIM system may be accessible over a secure IP network.

An additional embodiment includes a system and method for intelligent data center power management and energy market disaster recovery. The system is caused to employ continuous collection, monitoring and analysis of data from application services, power distribution components, virtual machines, data center facility infrastructure and utility energy markets to enable dynamic data center operation actions for migrating application loads and power loads from one data center to another without the need for manual intervention. The system and method may enable data center and application disaster recovery from utility energy market outages by quickly migrating applications loads from one data center location to another data center location.

The system and method for intelligent power management may employ a data collection layer that continuously collects data from a plurality of infrastructure elements, application elements, power elements and virtual machine elements. The data collected may then be analyzed by a plurality of analytic engines with the resulting data analysis triggering automation software comprised in the system that cause and enable the system to make data center operational state changes for application load balancing or power load balancing across multiple data centers.

According to an embodiment one or more data centers may be connected to one another by an IP network which may also connect to a plurality of energy markets. An energy market analysis layer comprised in the system software can use data collected from energy market elements to automatically manage data center and application disaster recovery from utility energy market outages. Preferred embodiments include software that causes the system to continuously monitor and analyze utility energy market status and enable intelligent application and data center load balancing that may provide financial benefits for moving applications and power loads from one data center location using power during peak energy hours to another data center location using power during off peak hours. The described systems and methods may quickly move applications and power loads from one data center to another enabling disaster recovery from utility energy market outages.

The purpose built marine vessel (1) is designed to comprise a heat exchange system (1) and to also cool the hot water returned from the water based closed-loop cooling system (3) acting as a hot water return cooling system (3). Some embodiments are designed to utilize the hull as a heat exchanger, wherein the heat exchange system is partially or completely comprised in the hull of the marine vessel. The thermal containment systems (4) capture the hot exhaust air and will use the thermal airflow system (5) to move the hot air through the water based closed-loop cooling system (3) and return the cooled air to the data center. All of the components are monitored and controlled by the management suite. (7) Logic designed to run the management software suite (7) can be implemented in several ways, with several variations and modifications, as would be apparent to a person having ordinary skill in the art.

A preferred embodiment design includes a purpose-built marine vessel to serve as a data center that will be submerged in water. Alternatively, the marine vessel is built to serve as a data center, floating on a water body. All components mentioned, namely, the heat exchange system, the water based cooling system, the hot water return cooling system, the thermal containment system, the thermal air flow system, and the software management suite, are installed in such a way that leverages the surrounding environment (Nature) for cooling and wherein all components work together to manage heat created from IT load in the data center while achieving both energy efficiency and cost effectiveness.

Preferred embodiments include all of the above mentioned elements. Alternate embodiments utilize renewable energy sources such as solar photovoltaic, solar thermal, wind energy, tidal wave energy, thermal energy, etc. which can be leveraged for additional energy efficiency. Additionally, heat from the exhaust air or hot water return from the water based cooling system could also be used as a renewable energy source or used as part of a waste heat system.

The thermal containment, water based closed-loop cooling and thermal air flow system can all be reconfigured and purpose built to be used in office buildings, residential homes, schools, government buildings, cruise ships, naval vessels, mobile homes, temporary work sites, remote work sites, hospitals, apartment buildings, etc. Other variations, modifications, and applications are possible, as would be apparent to a person having ordinary skill in the art.

To use this invention, one would simply install their servers/equipment in our waterborne data center facility.

Additionally, partial or complete embodiments of the disclosed invention can be utilized in alternate applications without departing from the scope and spirit of the disclosure. For example, water based closed loop cooling systems that leverage natural resources within close proximity can be utilized to cool virtually anything, including but not limited to buildings or dwellings, in an energy-efficient and cost-effective manner.

Since various possible embodiments might be made of the above invention, and since various changes might be made in the embodiments above set forth, it is to be understood that all matter herein described or shown in the accompanying drawings is to be interpreted as illustrative and not to be considered in a limiting sense. Thus it will be understood by those skilled in the art of water borne vessels, and computer data centers and that although the preferred and alternate embodiments have been shown and described in accordance with the Patent Statutes, the invention is not limited thereto or thereby.

The figures illustrate the architecture, functionality, and operation of possible implementations of systems, methods and computer program products according to various embodiments of the present invention. It should also be noted that, in some alternative implementations, the functions noted/illustrated may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some portions of embodiments disclosed are implemented as a program product for use with an embedded processor. The program(s) of the program product defines functions of the embodiments (including the methods described herein) and can be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive, solid state disk drive, etc.);

and (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-accessible format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

The present invention and some of its advantages have been described in detail for some embodiments. It should be understood that although the system and process is described with reference to a water borne data center, the system and process may be used in other contexts as well. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

We claim:

1. A self-sustained data center facility comprising:
a marine vessel;
a reconfigurable thermal containment system contained in the marine vessel;
a computer data center comprised in the thermal containment system, wherein the computer data center comprises
a plurality of racks which comprise a corresponding plurality of pallet jack slots and recessed wheels,
a plurality of rack-mounted computer systems, and
a plurality of corresponding water-based closed-loop cooling units coupled to each rack in the plurality of racks;
a first power source resident on the marine vessel;
a second grid-based power source comprising a plurality of power elements external and connected to the marine vessel;
wherein the reconfigurable thermal containment system is configured to pump water from an environment surrounding the data center facility through filtered water intake pipes, and the plurality of closed-loop cooling units absorb heat generated by the computer systems via a single or plurality of heat exchangers comprised in the thermal containment system;
a software management suite configured to:
continuously collect environmental data and reconfigurable thermal containment system data via a plurality of wireless sensors; and
continuously collect data from a plurality of applications comprised in one or more of the plurality of rack-mounted computer systems, the first and second power sources, virtual machines comprised in the one or more of the plurality of rack-mounted computer systems, and utility energy markets via a data collection layer;
based on the data collected by the plurality of wireless sensors and the data collection layer, automatically, and without manual intervention, enable dynamic data center facility operation actions for migrating application loads and power loads from the data center facility to another data center facility over a network; and
a predictive analytics engine comprised in the software management suite configured to dynamically control the thermal containment system based on the application and power load migration and data center facility operational states to sustain optimal data center facility efficiency.

2. The data center facility of claim 1 wherein the closed loop cooling units are further comprised in a water-based closed loop cooling system.

3. The data center facility of claim 1 wherein the reconfigurable thermal containment system further comprises:
a single deployment of cooling input, wherein the cooling input is the surrounding water;
a single or plurality of filtered water exhaust pipes;
a single or plurality of water pumps, coolant heat exchange piping, and coolant distribution piping;
a closed-loop coolant distribution unit; and
wherein the coolant distribution unit is caused to pass heated coolant through the coolant heat exchange piping, and wherein the surrounding water pumped through the filtered water intake pipes is caused to absorb heat from the heated coolant via the single or plurality of heat exchangers.

4. The data center facility of claim 3 wherein, the filtered water intake pipes and filtered water exhaust pipes are comprised in the bow (front) or stern (back) section of the marine vessel.

5. The data center facility of claim 3 wherein the filtered water intake pipes and filtered water exhaust pipes are comprised in the starboard (right) or port (left) section of the marine vessel.

6. The data center facility of claim 3 wherein the closed-loop coolant distribution unit is connected to the single or plurality of heat exchangers.

7. A method comprising:
generating electrical power;
providing the generated electrical power to a data center facility, wherein any power not used by the data center facility is stored as back-up or transmitted through a grid network;
pumping water surrounding the data center facility, wherein the data center facility comprises a marine vessel, the marine vessel comprises a reconfigurable thermal containment system, the thermal containment system comprises a computer data center, the computer data center comprises a plurality of racks which comprise a corresponding plurality of pallet jack slots and recessed wheels, a plurality of rack-mounted computer systems and a plurality of corresponding water-based closed-loop cooling units coupled to each rack in the plurality of racks, wherein the configurable thermal containment system circulates the pumped water;

wherein the reconfigurable thermal containment system further comprises a single or plurality of heat exchangers;

wherein the surrounding water is pumped by water pumps through filtered water intake pipes and pumped through a first side of the single or plurality of heat exchangers to cool hot coolant pumped through a second side of the single or plurality of heat exchangers;

expelling the pumped water after absorbing the heat from the hot coolant through filtered water exhaust pipes; and via a software management suite:
  continuously collecting environmental data and reconfigurable thermal containment system data via a plurality of wireless sensors; and
  continuously collecting data from a plurality of applications in a single or plurality of the rack-mounted computer systems comprised in the data center facility, a first power source resident on the marine vessel, a second grid-based power source external and connected to the marine vessel, virtual machines in the single or plurality of the rack-mounted computer systems, and utility energy markets via a data collection layer; and based on the data collected via the plurality of wireless sensors and the data collection layer, automatically and without manual intervention enabling dynamic data center facility operation actions for migrating application loads and power loads from the data center facility to another data center facility over a network; and via a predictive analytics engine comprised in the software management suite, dynamically controlling the thermal containment system based on the application and power load migration and data center facility operational states to sustain optimal data center facility efficiency.

8. The method of claim 7, further comprising:
capturing hot exhaust air and returning cooled air to the data center facility; and
wherein the hot exhaust air is captured via a reconfigurable thermal air flow system and the thermal airflow system is utilized to move the captured hot exhaust air through the closed loop cooling units, and return the cooled air.

9. The method of claim 7, further comprising:
based on the data collected from energy markets automatically managing data center facility and application disaster recovery from utility energy market outages, which comprises moving the application loads and power loads from the data center facility to the another data center facility, and enabling disaster recovery from the utility energy market outages.

10. In a data center facility, a method of monitoring and managing the facility, the method comprising:
continuously collecting environmental data and data center facility data by a plurality of wireless sensors;
continuously collecting data by a data collection layer from a plurality of applications in a single or plurality of computing units comprised in the data center facility, a first power source resident on the data center facility, a second grid-based power source external and connected to the data center facility, virtual machines in the single or plurality of computing units, and utility energy markets;
storing the collected data from the wireless sensors and the data collection layer in a database; and
analyzing the stored data by a predictive analytics engine, wherein the analyzed data is employed by a software management suite to manage operational states of the data center facility, the applications, the first and second power sources, and the virtual machines;
dynamically migrating application data loads and power loads from the data center facility to another datacenter facility over a network based on the analyzed data; and
dynamically controlling a reconfigurable thermal containment system based on the dynamic migration to sustain optimal data center facility efficiency, wherein the data center facility comprises a marine vessel, the marine vessel comprises the thermal containment system, the thermal containment system comprises a plurality of racks which comprise a corresponding plurality of pallet jack slots and recessed wheels, a plurality of rack-mounted computer systems, and a plurality of corresponding water-based closed-loop cooling units coupled to each rack in the plurality of racks.

11. The method of claim 10 further comprising:
accessing the software management suite over a secure network wherein presentation software comprised in the software management suite enables display of all the collected and analyzed data.

12. The method of claim 10 further comprising:
connecting via the network, the data center facility to a single or plurality of the utility energy markets such that an energy market analysis layer comprised in the software management suite uses data collected from the single or plurality of the energy markets to automatically manage data center facility and application disaster recovery from utility energy market outages.

13. The method of claim 10 further comprising:
in intelligent data center facility power management and energy market disaster recovery, monitoring and analyzing utility energy market status for data center facility load balancing; and
wherein the said load balancing comprises moving application loads and power loads from one data center facility location using power during peak energy hours to another data center facility location using power during off-peak hours over the network.

* * * * *